(12) United States Patent
Li

(10) Patent No.: US 9,716,119 B2
(45) Date of Patent: Jul. 25, 2017

(54) MANUFACTURING METHOD OF DUAL GATE TFT SUBSTRATE AND STRUCTURE THEREOF

(71) Applicant: Shenzhen China Star Optoelectronics Technology Co., Ltd., Shenzhen (CN)

(72) Inventor: Wenhui Li, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 143 days.

(21) Appl. No.: 14/770,091

(22) PCT Filed: May 25, 2015

(86) PCT No.: PCT/CN2015/079665
§ 371 (c)(1),
(2) Date: Aug. 25, 2015

(87) PCT Pub. No.: WO2016/176881
PCT Pub. Date: Nov. 10, 2016

(65) Prior Publication Data
US 2017/0141140 A1  May 18, 2017

(30) Foreign Application Priority Data
May 6, 2015 (CN) .......................... 2015 1 0226863

(51) Int. Cl.
*H01L 27/12* (2006.01)
*H01L 29/786* (2006.01)
*H01L 29/49* (2006.01)

(52) U.S. Cl.
CPC ........ *H01L 27/1288* (2013.01); *H01L 27/127* (2013.01); *H01L 27/1222* (2013.01);
(Continued)

(58) Field of Classification Search
CPC ............. H01L 27/1214; H01L 27/1288; H01L 29/78648
See application file for complete search history.

(56) References Cited

U.S. PATENT DOCUMENTS 5,658,806 A * 8/1997 Lin .................... H01L 29/41733
257/E21.412
6,084,248 A * 7/2000 Inoue ................ H01L 29/78696
257/347
(Continued)

FOREIGN PATENT DOCUMENTS

CN           104465788 A          3/2015

*Primary Examiner* — Evan Pert
(74) *Attorney, Agent, or Firm* — Leong C. Lei

(57) ABSTRACT

Disclosed are a manufacturing method of a dual gate TFT substrate and a structure thereof. The manufacturing method of a dual gate TFT substrate includes sequentially manufacturing a bottom gate, a first isolation layer, an island shaped semiconductor layer, and a second isolation layer on a substrate; then, depositing a second metal layer, and implementing a patterning process to the second metal layer with one mask to form a source, a drain and a top gate at the same time; and then, sequentially manufacturing a third isolation layer and a pixel electrode. It can promote the stability of the TFT, reduce the amount of the masks, and shorten the process flow, simplifying the manufacture process and diminishing the production cost. In the structure of the dual gate TFT substrate, the structure is simple, and the stability of the TFT is better, and easy to manufacture.

11 Claims, 5 Drawing Sheets

(52) U.S. Cl.
CPC ...... *H01L 27/1225* (2013.01); *H01L 29/4908* (2013.01); *H01L 29/7869* (2013.01); *H01L 29/78648* (2013.01); *H01L 29/78663* (2013.01); *H01L 29/78672* (2013.01)

(56) References Cited

U.S. PATENT DOCUMENTS

| | | | |
|---|---|---|---|
| 6,534,788 B1* | 3/2003 | Yeo | H01L 29/41733 |
| | | | 257/66 |
| 6,673,661 B1* | 1/2004 | Liu | H01L 29/6675 |
| | | | 257/E21.412 |
| 9,129,992 B2* | 9/2015 | Zhang | |
| 2005/0275038 A1* | 12/2005 | Shih | H01L 29/78633 |
| | | | 257/382 |
| 2009/0050894 A1* | 2/2009 | Park | H01L 29/458 |
| | | | 257/72 |
| 2010/0006835 A1* | 1/2010 | Yoon | H01L 27/12 |
| | | | 257/43 |
| 2016/0133473 A1* | 5/2016 | Wang | H01L 21/28114 |
| | | | 257/72 |
| 2016/0307932 A1* | 10/2016 | Ge | H01L 21/02565 |
| 2016/0308066 A1* | 10/2016 | Ge | G02F 1/13439 |
| 2016/0343872 A1* | 11/2016 | Ge | H01L 29/786 |

\* cited by examiner

MANUFACTURING METHOD OF DUAL GATE TFT SUBSTRATE AND STRUCTURE THEREOF

FIELD OF THE INVENTION

The present invention relates to a display technology field, and more particularly to a manufacturing method of a dual gate TFT substrate and a structure thereof.

BACKGROUND OF THE INVENTION

In the display technology field, the flat panel display device has been gradually replaced the Cathode Ray Tube (CRT) display. The flat panel device possesses advantages of high image quality, power saving, thin body and no irradiation. Thus, it has been widely applied in various consumer electrical products, such as mobile phones, televisions, personal digital assistants, digital cameras, notebooks, and laptops, and becomes the major display device.

The common flat panel display device at present mainly comprises a Liquid Crystal Display (LCD) and an Active Matrix Organic Light-Emitting Diode (AMOLED). The Thin Film transistors (TFT) can be formed on a glass substrate or a plastic substrate. Generally, the thin film transistors are employed as switching elements and driving elements utilized in the flat panel display devices such as LCDs, AMOLEDs.

The oxide semiconductor TFT technology is the most popular skill at present. The oxide semiconductor has higher electron mobility. The manufacturing process of the oxide semiconductor is simple in comparison with the Low Temperature Poly-silicon semiconductor and has higher compatibility with the amorphous silicon process. It can be applied to display devices such as LCDs, AMOLEDs and has the great opportunity of application development. However, the traditional oxide semiconductor TFT is the single gate structure in general. The stability issues including the environment stability, the stress bias stability and mask stability issues exist. For solving the stability issues of the single gate oxide semiconductor TFT, a dual gate structure TFT substrate is proposed for promoting the stability of the TFT and reducing the drift of the threshold voltage (Vth). As shown in FIG. 1, a dual gate TFT substrate according to prior art comprises: a substrate 10, a bottom gate 20, a first isolation layer 30, an oxide island shaped semiconductor layer 40, a second isolation layer 50, a source/a drain 60, a third isolation layer 70, a top gate 80, a fourth isolation layer 90 and a pixel electrode 100 sequentially stacked on the substrate 10. The source/the drain 60 contact the oxide island shaped semiconductor layer 40 with via holes penetrating the second isolation layer 50 to form electrical connections; the pixel electrode 100 contacts the source/the drain 60 with via holes penetrating the fourth isolation layer 90 and the third isolation layer 70 to form electrical connections.

Particularly, in the dual gate TFT substrate according to prior art, the bottom gate 20 is positioned on the substrate 10, and the source/the drain 60 are positioned on the second isolation layer 50, and the top gate 80 is positioned on the third isolation layer 70. The source/the drain 60 and the top gate 80 are respectively at different layers. Therefore, one single mask is required for manufacturing one of the bottom gate 20, the source/the drain 60 and the top gate 80. The necessary amount of the masks is more and the process flow is longer. The manufacturing process is more complicated and the production cost is higher.

SUMMARY OF THE INVENTION

An objective of the present invention is to provide a manufacturing method of a dual gate TFT substrate, which can promote the stability of the TFT for reducing the amount of the masks, and shortening the process flow, simplifying the manufacturing process and diminishing the production cost.

Another objective of the present invention is to provide a structure of a dual gate TFT substrate, of which the structure is simple, and the stability of the TFT is better, and easy to manufacture.

For realizing the aforesaid objectives, the present invention first provides a manufacturing method of a dual gate TFT substrate, sequentially manufacturing a bottom gate, a first isolation layer, an island shaped semiconductor layer, a second isolation layer on a substrate in advance; then, depositing a second metal layer, and implementing a patterning process to the second metal layer with one mask to form a source, a drain and a top gate at the same time; and then, sequentially manufacturing a third isolation layer and a pixel electrode, and specifically comprising steps of:

step 1, providing a substrate, and depositing a first metal layer on the substrate, and implementing a pattern process to the first metal layer with a first mask to form a bottom gate;

step 2, depositing the first isolation layer on the bottom gate and the substrate;

step 3, depositing a semiconductor layer on the first isolation layer, and implementing a patterning process to the semiconductor layer with a second mask to form the island shaped semiconductor layer correspondingly positioned above the bottom gate;

step 4, depositing the second isolation layer on the island shaped semiconductor layer and the first isolation layer, and implementing a patterning process to the second isolation layer with a third mask to form a first via and a second via penetrating the second isolation layer to respectively expose two ends of the island shaped semiconductor layer;

step 5, depositing a second metal layer on the second isolation layer, and implementing a patterning process to the second metal layer with a fourth mask to form the source, the drain and the top gate at the same time;

the source, the drain respectively contact the two ends of the island shaped semiconductor layer through the first, second vias, and the top gate is positioned between the source and the drain;

the bottom gate, the island shaped semiconductor layer, the source, the drain and the top gate construct a dual gate TFT;

step 6, depositing the third isolation layer on the source, the drain, the top gate and the second isolation layer, and implementing a patterning process to the third isolation layer with a fifth mask to form a third via penetrating the third isolation layer to expose a partial surface of the drain;

step 7, depositing a pixel electrode layer on the third isolation layer, and implementing a patterning process to the pixel electrode layer with a sixth mask to form the pixel electrode, and the pixel electrode contacts the drain through the third via.

The step 4 also implements a patterning process to the first isolation layer to form a via penetrating the second isolation layer and the first isolation layer to expose a partial surface of the bottom gate as implementing a patterning process to the second isolation layer with the third mask; the top gate formed in the step 6 contacts the bottom gate through the via.

Material of the first metal layer and the second metal layer is a stack combination of one or more of molybdenum, titanium, aluminum and copper.

Material of the first isolation and the second isolation layer is Silicon Oxide, Silicon Nitride or a combination of the two, and material of the third isolation layer is organic photoresist.

Material of the semiconductor layer is oxide semiconductor, amorphous silicon semiconductor or Low Temperature Poly-silicon semiconductor.

The pixel electrode is a transparent electrode.

The present invention further provides a structure of a dual gate TFT substrate, comprising a substrate, a bottom gate positioned on the substrate, a first isolation layer positioned on the bottom gate and the substrate, an island shaped semiconductor layer positioned on first isolation layer above the bottom gate, a second isolation layer positioned on the island shaped semiconductor layer and the first isolation layer, a source, a drain and a top gate positioned on the second isolation layer, a third isolation layer positioned on the source, the drain, the top gate and the second isolation layer, and a pixel electrode position on the third isolation layer;

the second isolation layer comprises a first via and a second via penetrating the second isolation layer, and the third isolation layer comprises a third via penetrating the third isolation layer; the source, the drain respectively contact the two ends of the island shaped semiconductor layer through the first, second vias, and the top gate is positioned between the source and the drain; the pixel electrode contacts the drain through the third via;

the bottom gate, the island shaped semiconductor layer, the source, the drain and the top gate construct a dual gate TFT.

The second isolation layer and the first isolation layer further comprise a via penetrating the second isolation layer and the first isolation layer, and the top gate contacts the bottom gate through the via.

Material of the bottom gate, the source, the drain and the top gate is a stack combination of one or more of molybdenum, titanium, aluminum and copper;

material of the first isolation and the second isolation layer is Silicon Oxide, Silicon Nitride or a combination of the two, and material of the third isolation layer is organic photoresist;

material of the island shaped semiconductor layer is oxide semiconductor, amorphous silicon semiconductor or Low Temperature Poly-silicon semiconductor;

the pixel electrode is a transparent electrode.

The present invention further provides a manufacturing method of a dual gate TFT substrate, sequentially manufacturing a bottom gate, a first isolation layer, an island shaped semiconductor layer, a second isolation layer on a substrate in advance; then, depositing a second metal layer, and implementing a patterning process to the second metal layer with one mask to form a source, a drain and a top gate at the same time; and then, sequentially manufacturing a third isolation layer and a pixel electrode;

wherein, the method specifically comprises steps of:

step 1, providing a substrate, and depositing a first metal layer on the substrate, and implementing a patterning process to the first metal layer with a first mask to form a bottom gate;

step 2, depositing the first isolation layer on the bottom gate and the substrate;

step 3, depositing a semiconductor layer on the first isolation layer, and implementing a patterning process to the semiconductor layer with a second mask to form the island shaped semiconductor layer correspondingly positioned above the bottom gate;

step 4, depositing the second isolation layer on the island shaped semiconductor layer and the first isolation layer, and implementing a patterning process to the second isolation layer with a third mask to form a first via and a second via penetrating the second isolation layer to respectively expose two ends of the island shaped semiconductor layer;

step 5, depositing a second metal layer on the second isolation layer, and implementing a patterning process to the second metal layer with a fourth mask to form the source, the drain and the top gate at the same time;

the source, the drain respectively contact the two ends of the island shaped semiconductor layer through the first, second vias, and the top gate is positioned between the source and the drain;

the bottom gate, the island shaped semiconductor layer, the source, the drain and the top gate construct a dual gate TFT;

step 6, depositing the third isolation layer on the source, the drain, the top gate and the second isolation layer, and implementing a patterning process to the third isolation layer with a fifth mask to form a third via penetrating the third isolation layer to expose a partial surface of the drain;

step 7, depositing a pixel electrode layer on the third isolation layer, and implementing a patterning process to the pixel electrode layer with a sixth mask to form the pixel electrode, and the pixel electrode contacts the drain through the third via;

wherein the step 4 also implements a patterning process to the first isolation layer to form a via penetrating the second isolation layer and the first isolation layer to expose a partial surface of the bottom gate as implementing a patterning process to the second isolation layer with the third mask; the top gate formed in the step 6 contacts the bottom gate through the via;

wherein material of the first metal layer and the second metal layer is a stack combination of one or more of molybdenum, titanium, aluminum and copper;

wherein material of the first isolation and the second isolation layer is Silicon Oxide, Silicon Nitride or a combination of the two, and material of the third isolation layer is organic photoresist;

wherein material of the semiconductor layer is oxide semiconductor, amorphous silicon semiconductor or Low Temperature Poly-silicon semiconductor;

wherein the pixel electrode is a transparent electrode.

The benefits of the present invention are: in the manufacturing method of the dual gate TFT substrate provided by the present invention, the stability of the TFT is promoted by manufacturing the bottom gate and the top gate; one mask is employed to implement one patterning process to form the source, the drain and the top gate at the same time, which is capable of reducing the amount of the masks, and shortening the process flow, simplifying the manufacturing process and diminishing the production cost. In the structure of the dual gate TFT substrate provided by the present invention, the stability of the TFT is better by manufacturing the bottom gate and the top gate. The source, the drain and the top gate are positioned on the second isolation layer together to make the structure of the dual gate TFT substrate simple and easy to manufacture.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
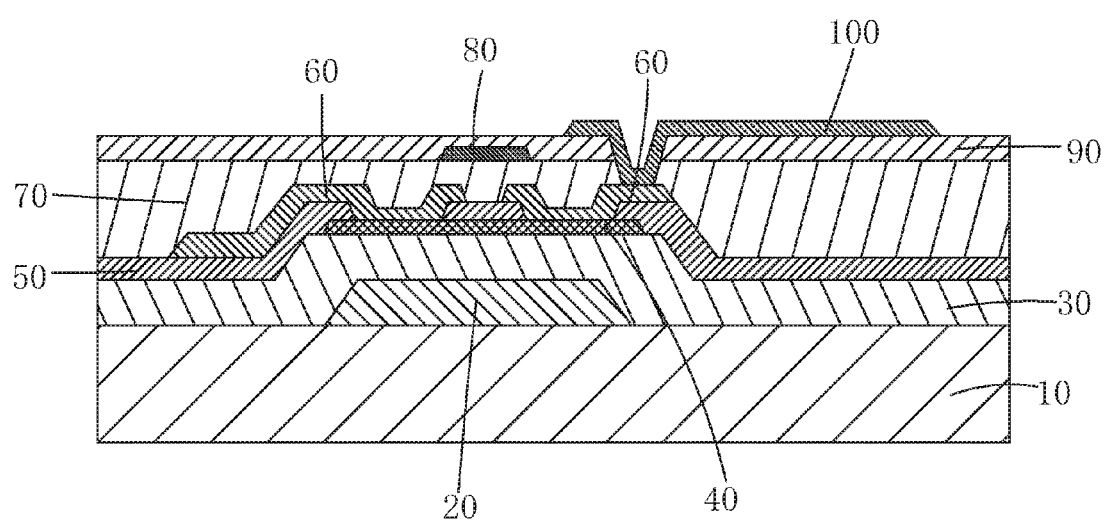
FIG. 1 is a structural diagram of a dual gate TFT substrate according to prior art.
Figure 2:
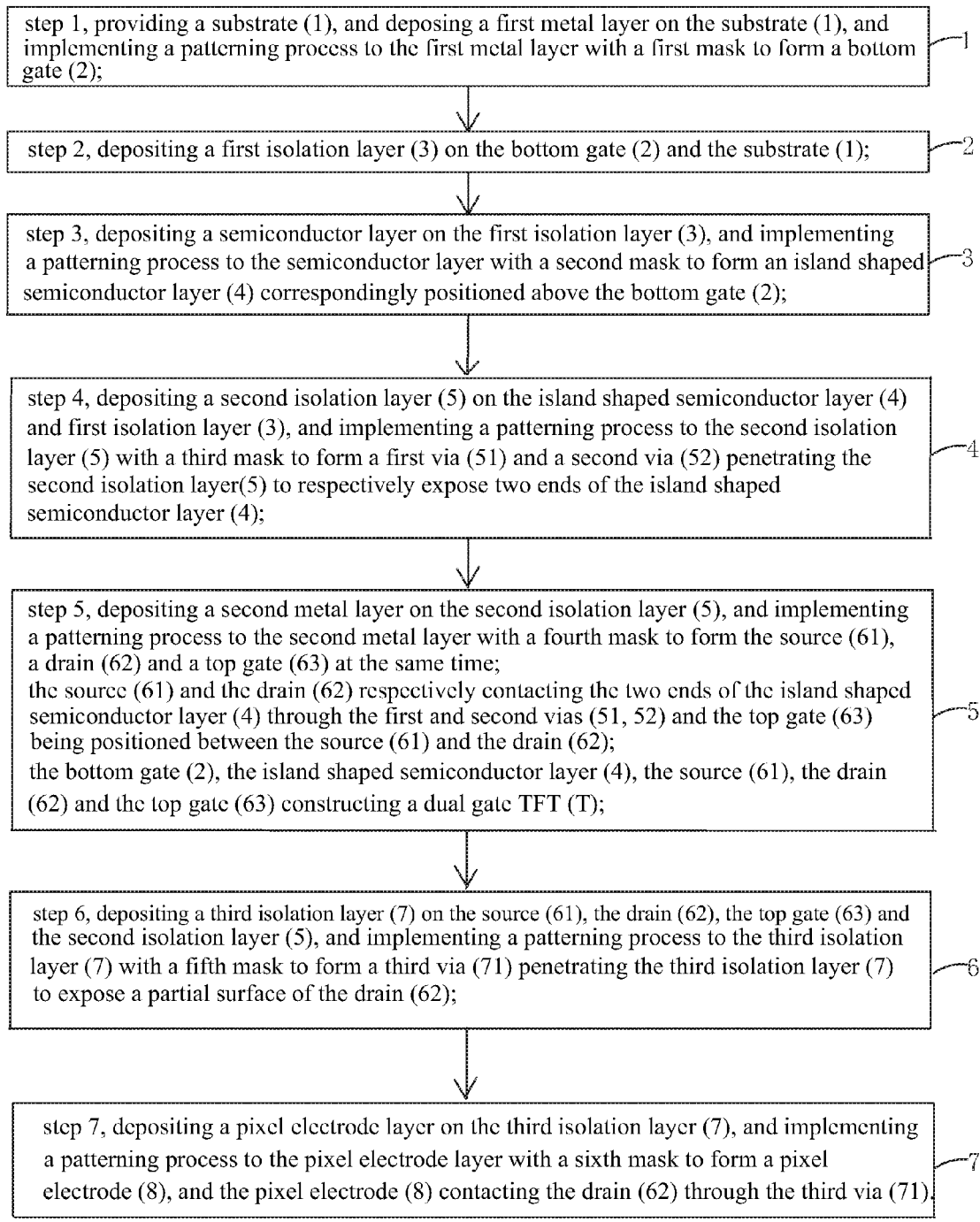
FIG. 2 is a flowchart of a manufacturing method of a dual gate TFT substrate according to the present invention.
Figure 3:
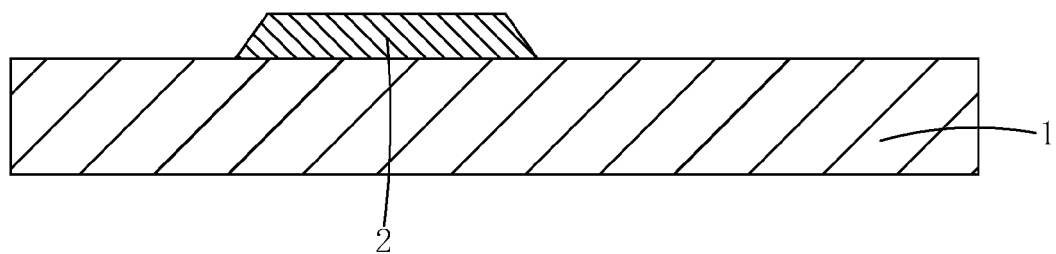
FIG. 3 is a diagram of step 1 of the manufacturing method of the dual gate TFT substrate according to the present invention.

Please refer to FIG. 2. The present invention first provides a manufacturing method of a dual gate TFT substrate, comprising steps of:

step 1, as shown in FIG. 3, providing a substrate 1, and depositing a first metal layer on the substrate 1, and implementing a patterning process to the first metal layer with a first mask to form a bottom gate 2.

Specifically, the step 1 utilizes Physical Vapor Deposition (PVD) for depositing the first metal layer. Material of the first metal layer is a stack combination of one or more of molybdenum, titanium, aluminum and copper.

Figure 4:
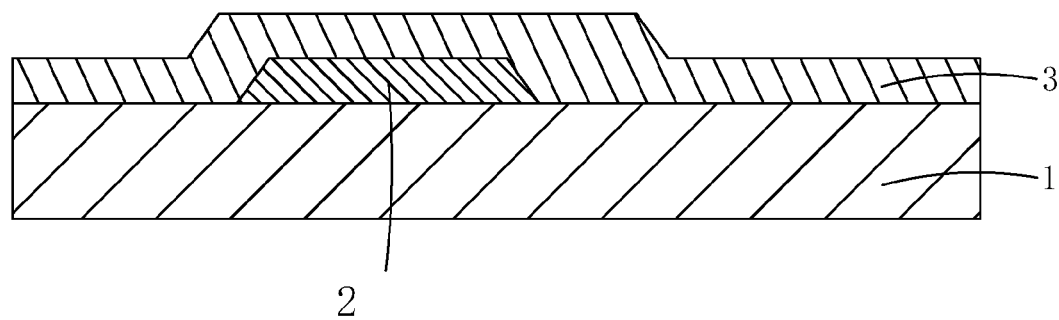
FIG. 4 is a diagram of step 2 of the manufacturing method of the dual gate TFT substrate according to the present invention.

The step 1 utilizes a photolithographic process to implement a patterning process to the first metal layer, which comprises manufacturing processes of photoresist coating, exposure, development, wet etching and photoresist stripping.

step 2, as shown in FIG. 4, depositing a first isolation layer 3 on the bottom gate 2 and the substrate 1.

Figure 5:
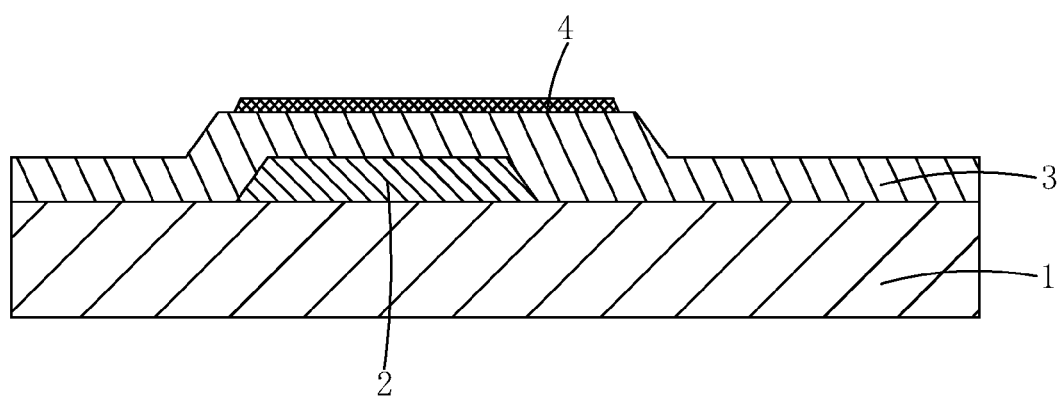
FIG. 5 is a diagram of step 3 of the manufacturing method of the dual gate TFT substrate according to the present invention.

Specifically, the step 2 utilizes Chemical Vapor Deposition (CVD) for depositing the first isolation layer 3. Material of the first insulation layer 3 is Silicon Nitride, Silicon Oxide or a combination of the two.

step 3, as shown in FIG. 5, depositing a semiconductor layer on the first isolation layer 3, and implementing a patterning process to the semiconductor layer with a second mask to form the island shaped semiconductor layer 4 correspondingly positioned above the bottom gate 2.

Specifically, the step 3 utilizes physical vapor deposition for depositing the semiconductor layer. Material of the semiconductor layer is oxide semiconductor (such as Indium Gallium Zinc Oxide (IGZO) semiconductor), amorphous silicon semiconductor or Low Temperature Poly-silicon semiconductor.

Figure 6:
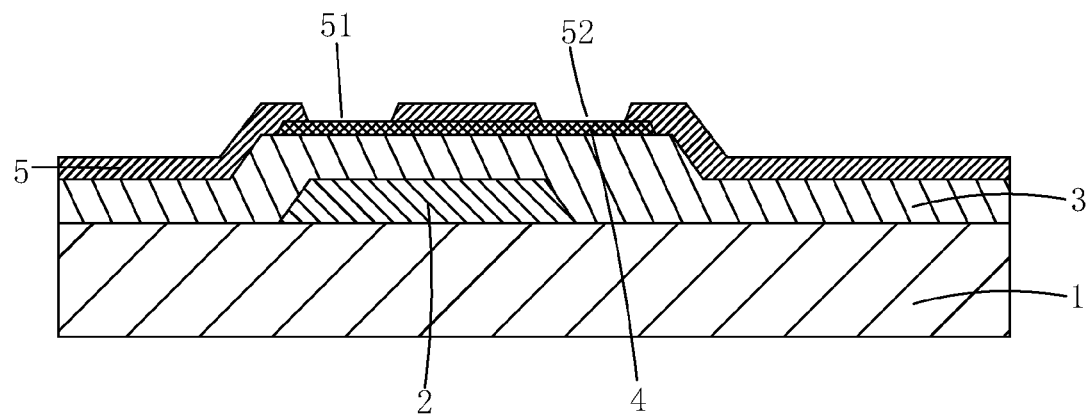
FIG. 6 is a diagram of step 4 of the manufacturing method of the dual gate TFT substrate according to the present invention.

The step 3 utilizes a photolithographic process to implement a patterning process to the semiconductor layer, which comprises manufacturing processes of photoresist coating, exposure, development, wet etching and photoresist stripping.

step 4, as shown in FIG. 6, depositing the second isolation layer 5 on the island shaped semiconductor layer 4 and the first isolation layer 3, and implementing a patterning process to the second isolation layer 5 with a third mask to form a first via 51 and a second via 52 penetrating the second isolation layer 5 to respectively expose two ends of the island shaped semiconductor layer 4.

Specifically, the step 4 utilizes chemical vapor deposition for depositing the second isolation layer 5. Material of the second insulation layer 5 is Silicon Nitride, Silicon Oxide or a combination of the two.

Figure 7:
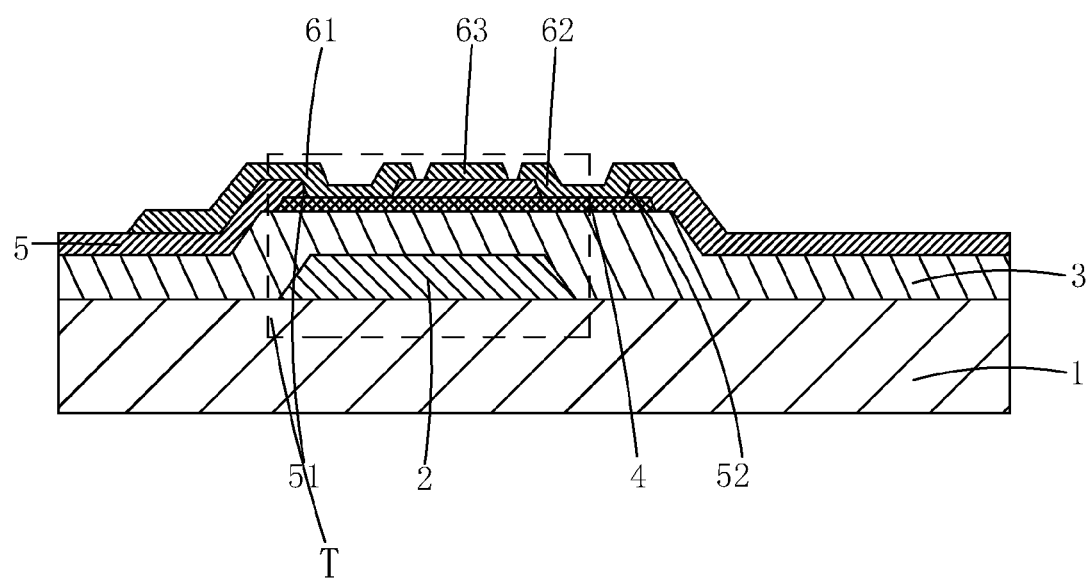
FIG. 7 is a diagram of step 5 of the manufacturing method of the dual gate TFT substrate according to the present invention.

The step 4 utilizes a photolithographic process to implement a patterning process to the second isolation layer 5, which comprises manufacturing processes of photoresist coating, exposure, development, dry etching and photoresist stripping.

step 5, as shown in FIG. 7, depositing a second metal layer on the second isolation layer 5, and implementing a patterning process to the second metal layer with a fourth mask to form the source 61, the drain 62 and the top gate 63 at the same time.

The source 61, the drain 62 respectively contact the two ends of the island shaped semiconductor layer 4 through the first, second vias 51, 52 to make the source 61, the drain 62 respectively form electrical connections with the island shaped semiconductor layer 4; the top gate 63 is positioned between the source 61 and the drain 62.

The bottom gate 2, the island shaped semiconductor layer 4, the source 61, the drain 62 and the top gate 63 construct a dual gate TFT T.

Specifically, the step 5 utilizes physical vapor deposition for depositing the second metal layer. Material of the second metal layer is a stack combination of one or more of molybdenum, titanium, aluminum and copper.

Figure 8:
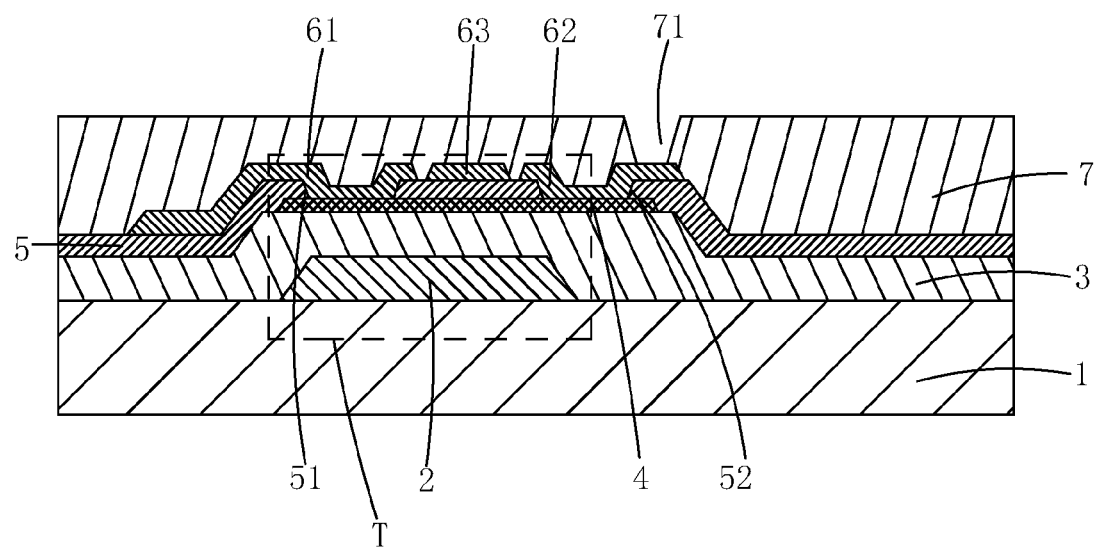
FIG. 8 is a diagram of step 6 of the manufacturing method of the dual gate TFT substrate according to the present invention.

The step 5 utilizes a photolithographic process to implement a patterning process to the second metal layer, which comprises manufacturing processes of photoresist coating, exposure, development, wet etching and photoresist stripping.

step 6, as shown in FIG. 8, depositing the third isolation layer 7 on the source 61, the drain 62, the top gate 63 and the second isolation layer 5, and implementing a patterning process to the third isolation layer 7 with a fifth mask to form a third via 71 penetrating the third isolation layer 7 to expose a partial surface of the drain 62.

Figure 9:
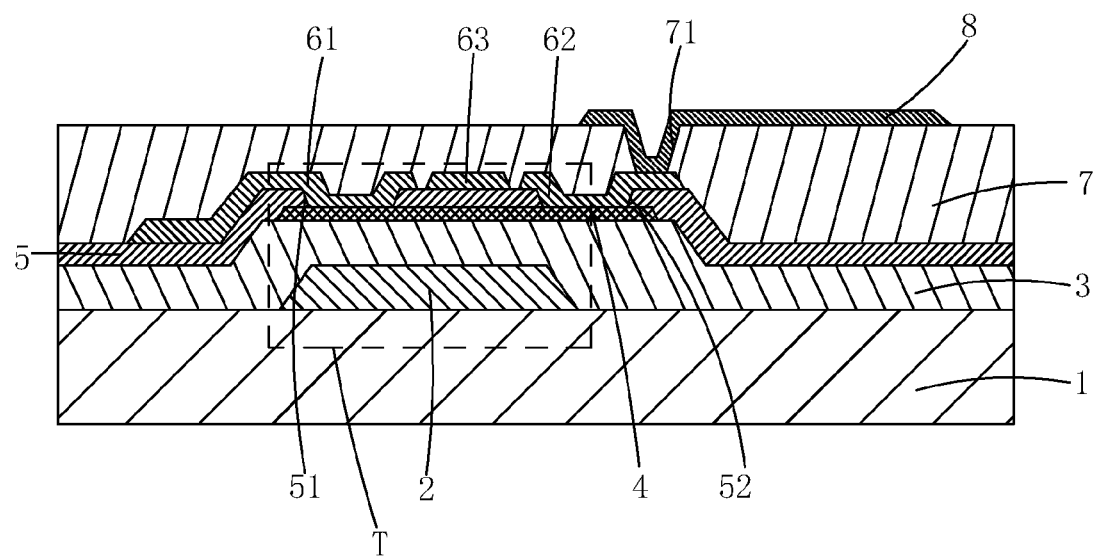
FIG. 9 is a diagram of step 7 of the manufacturing method of the dual gate TFT substrate according to the present invention and also a diagram of a structure of a dual gate TFT substrate according to the present invention.

Specifically, material of the third isolation layer 7 is organic photoresist functioning for isolation and planarization.

step 7, as shown in FIG. 9, depositing a pixel electrode layer on the third isolation layer 7, and implementing a patterning process to the pixel electrode layer with a sixth mask to form the pixel electrode 8, and the pixel electrode 8 contacts the drain 62 through the third via 71 to make the pixel electrode 8 and the drain 62 form an electrical connection.

Specifically, the pixel electrode 8 is a transparent electrode, such as Indium Tin Oxide (ITO), Indium Zinc Oxide (IZO) and etc.

Significantly, in the TFT substrate manufactured with the aforesaid step 1 to step 7, no electrical connection is formed between the top gate 63 and the bottom gate 2. However, the step 4 also implements a patterning process to the first isolation layer 3 to form a via penetrating the second isolation layer 5 and the first isolation layer 3 to expose a partial surface of the bottom gate 2 as implementing patterning process to the second isolation layer 5 with the third mask; the top gate 63 formed in the step 6 contacts the bottom gate 2 through the via to make the electrical connection form between the top gate 63 and the bottom gate 2.

The manufacturing method of the dual gate TFT substrate provided by the present invention, comprises sequentially manufacturing a bottom gate 2, a first isolation layer 3, an island shaped semiconductor layer 4, a second isolation layer 5 on a substrate 1 in advance; then, depositing a second metal layer, and implementing patterning process to the second metal layer with one mask to form a source 61, a drain 62 and a top gate 63 at the same time; and then, sequentially manufacturing a third isolation layer 7 and a pixel electrode 8. The bottom gate 2 and the top gate 63 can promote the stability of the TFT; one mask is employed to implement one patterning process to form the top gate 63 and the source 61, the drain 62 at the same time, which is capable of reducing the amount of the masks, and shortening the process flow, simplifying the manufacturing process and diminishing the production cost.

Please refer to FIG. 9. The present invention further provides a structure of a dual gate TFT substrate manufactured by the aforesaid manufacturing method, comprising a substrate 1, a bottom gate 2 positioned on the substrate 1, a first isolation layer 3 positioned on the bottom gate 2 and the substrate 1, an island shaped semiconductor layer 4 positioned on first isolation layer 3 above the bottom gate 2, a second isolation layer 5 positioned on the island shaped semiconductor layer 4 and the first isolation layer 3, a source 61, a drain 62 and a top gate 63 positioned on the second isolation layer 5, a third isolation layer 7 positioned on the source 61, the drain 62, the top gate 63 and the second isolation layer 5, and a pixel electrode 8 position on the third isolation layer 7.

The second isolation layer 5 comprises a first via 51 and a second via 52 penetrating the second isolation layer 5, and the third isolation layer 7 comprises a third via 71 penetrating the third isolation layer 7; the source 61, the drain 62 respectively contact the two ends of the island shaped semiconductor layer 4 through the first, second vias 51, 52, and the top gate 63 is positioned between the source 61 and the drain 62; the pixel electrode 8 contacts the drain 62 through the third via 71.

The bottom gate 2, the island shaped semiconductor layer 4, the source 61, the drain 62 and the top gate 63 construct a dual gate TFT T.

Significantly, the electrical connection can be formed between the top gate 63 and the bottom gate 2 or not. Under circumstance that the electrical connection is formed between the top gate 63 and the bottom gate 2, the second isolation layer 5 and the first isolation layer 3 further comprise a via penetrating the second isolation layer 5 and the first isolation layer 3, and the top gate 63 contacts the bottom gate 2 through the via.

In the structure of the dual gate TFT substrate provided by the present invention, the stability of the TFT is better by manufacturing the bottom gate 2 and the top gate 63. The source 61, the drain 62 and the top gate 63 are positioned on the second isolation layer 5 together to make the structure of the dual gate TFT substrate simple, and one mask is employed to implement one patterning process to form the source 61, the drain 62 and the top gate 63 at the same time. The process flow is shortened and easy to manufacture.

Specifically, material of the bottom gate 2, the source 61, the drain 62 and the top gate 63 is a stack combination of one or more of molybdenum, titanium, aluminum and copper.

Material of the first isolation layer 3 and the second isolation layer 5 is Silicon Nitride, Silicon Oxide, or a combination of the two; material of the third isolation layer 7 is organic photoresist functioning for isolation and planarization.

Material of the island shaped semiconductor layer 4 is oxide semiconductor (such as IGZO), amorphous silicon semiconductor or Low Temperature Poly-silicon semiconductor.

The pixel electrode 8 is a transparent electrode, such as ITO, IZO and etc.

In conclusion, in the manufacturing method of the dual gate TFT substrate according to the present invention, the stability of the TFT is promoted by manufacturing the bottom gate and the top gate; one mask is employed to implement one patterning process to form the source, the drain and the top gate at the same time, which is capable of reducing the amount of the masks, and shortening the process flow, simplifying the manufacturing process and diminishing the production cost. In the structure of the dual gate TFT substrate according the present invention, the stability of the TFT is better by manufacturing the bottom gate and the top gate. The source, the drain and the top gate are positioned on the second isolation layer together to make the structure of the dual gate TFT substrate simple and easy to manufacture.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of a dual gate thin film transistor (TFT) substrate, comprising: sequentially manufacturing a bottom gate, a first isolation layer, an island shaped semiconductor layer, and a second isolation layer on a substrate; then, disposing a second metal layer, and implementing a patterning process to the second metal layer with one mask to form a source, a drain and a top gate at the same time; and then, sequentially manufacturing a third isolation layer and a pixel electrode.

2. The manufacturing method of the dual gate TFT substrate according to claim 1, further comprising steps of:
   step 1, providing a substrate, and depositing a first metal layer on the substrate, and implementing a patterning process to the first metal layer with a first mask to form a bottom gate;
   step 2, depositing the first isolation layer on the bottom gate and the substrate;
   step 3, depositing a semiconductor layer on the first isolation layer, and implementing a patterning process to the semiconductor layer with a second mask to form the island shaped semiconductor layer correspondingly positioned above the bottom gate;

step 4, depositing the second isolation layer on the island shaped semiconductor layer and the first isolation layer, and implementing a patterning process to the second isolation layer with a third mask to form a first via and a second via penetrating the second isolation layer to respectively expose two ends of the island shaped semiconductor layer;

step 5, depositing a second metal layer on the second isolation layer, and implementing a patterning process to the second metal layer with a fourth mask to form the source, the drain and the top gate at the same time;

wherein the source and the drain respectively contact the two ends of the island shaped semiconductor layer through the first and second vias, and the top gate is positioned between the source and the drain; and the bottom gate, the island shaped semiconductor layer, the source, the drain and the top gate construct a dual gate TFT;

step 6, depositing the third isolation layer on the source, the drain, the top gate and the second isolation layer, and implementing a patterning process to the third isolation layer with a fifth mask to form a third via penetrating the third isolation layer to expose a partial surface of the drain; and step 7, depositing a pixel electrode layer on the third isolation layer, and implementing a patterning process to the pixel electrode layer with a sixth mask to form the pixel electrode, wherein the pixel electrode contacts the drain through the third via.

3. The manufacturing method of the dual gate TFT substrate according to claim 2, wherein the step 4 also implements a patterning process to the first isolation layer to form a via penetrating the second isolation layer and the first isolation layer to expose a partial surface of the bottom gate when implementing the patterning process to the second isolation layer with the third mask; and the top gate formed in the step 6 contacts the bottom gate through the via.

4. The manufacturing method of the dual gate TFT substrate according to claim 2, wherein a material of the first metal layer and the second metal layer is a stacked combination of one or more of molybdenum, titanium, aluminum and copper.

5. The manufacturing method of the dual gate TFT substrate according to claim 2, wherein a material of the first isolation and the second isolation layer is Silicon Oxide, Silicon Nitride or a combination of the two, and a material of the third isolation layer is organic photoresist.

6. The manufacturing method of the dual gate TFT substrate according to claim 2, wherein a material of the semiconductor layer is oxide semiconductor, amorphous silicon semiconductor or Low Temperature Poly-silicon semiconductor.

7. The manufacturing method of the dual gate TFT substrate according to claim 2, wherein the pixel electrode is a transparent electrode.

8. A structure of a dual gate thin film transistor (TFT) substrate, comprising a substrate, a bottom gate positioned on the substrate, a first isolation layer positioned on the bottom gate and the substrate, an island shaped semiconductor layer positioned on first isolation layer above the bottom gate, a second isolation layer positioned on the island shaped semiconductor layer and the first isolation layer, a source, a drain and a top gate positioned on the second isolation layer, a third isolation layer positioned on the source, the drain, the top gate and the second isolation layer, and a pixel electrode position on the third isolation layer;

wherein the second isolation layer comprises a first via and a second via penetrating the second isolation layer, and the third isolation layer comprises a third via penetrating the third isolation layer; the source, the drain, and the top gate are formed on and supported by a top surface of the second isolation layer such that a portion of the source and a portion of the drain are set to respectively contact two ends of the island shaped semiconductor layer through the first and second vias and the top gate is positioned on the top surface of the second isolation layer and between the source and the drain; the pixel electrode contacts the drain through the third via; and the bottom gate, the island shaped semiconductor layer, the source, the drain and the top gate construct a dual gate TFT.

9. The structure of the dual gate TFT substrate according to claim 8, wherein the second isolation layer and the first isolation layer further comprise a via penetrating the second isolation layer and the first isolation layer, and the top gate contacts the bottom gate through the via.

10. The structure of the dual gate TFT substrate according to claim 8, wherein a material of the bottom gate, the source, the drain and the top gate is a stacked combination of one or more of molybdenum, titanium, aluminum and copper;

a material of the first isolation and the second isolation layer is Silicon Oxide, Silicon Nitride or a combination of the two, and a material of the third isolation layer is organic photoresist;

a material of the island shaped semiconductor layer is oxide semiconductor, amorphous silicon semiconductor or Low Temperature Poly-silicon semiconductor; and the pixel electrode is a transparent electrode.

11. A manufacturing method of a dual gate TFT substrate, comprising: sequentially manufacturing a bottom gate, a first isolation layer, an island shaped semiconductor layer, and a second isolation layer on a substrate; then, deposing a second metal layer, and implementing a patterning process to the second metal layer with one mask to form a source, a drain and a top gate at the same time; and then, sequentially manufacturing a third isolation layer and a pixel electrode;

wherein the method further comprises steps of:

step 1, providing a substrate, and depositing a first metal layer on the substrate, and implementing a patterning process to the first metal layer with a first mask to form a bottom gate;

step 2, depositing the first isolation layer on the bottom gate and the substrate;

step 3, depositing a semiconductor layer on the first isolation layer, and implementing a patterning process to the semiconductor layer with a second mask to form the island shaped semiconductor layer correspondingly positioned above the bottom gate;

step 4, depositing the second isolation layer on the island shaped semiconductor layer and the first isolation layer, and implementing a patterning process to the second isolation layer with a third mask to form a first via and a second via penetrating the second isolation layer to respectively expose two ends of the island shaped semiconductor layer;

step 5, depositing a second metal layer on the second isolation layer, and implementing patterning process to the second metal layer with a fourth mask to form the source, the drain and the top gate at the same time;

wherein the source and the drain respectively contact the two ends of the island shaped semiconductor layer through the first and second vias, and the top gate is positioned between the source and the drain; and the bottom gate, the island shaped semiconductor layer, the source, the drain and the top gate construct a dual gate TFT;

step 6, depositing the third isolation layer on the source, the drain, the top gate and the second isolation layer, and implementing a patterning process to the third isolation layer with a fifth mask to form a third via penetrating the third isolation layer to expose a partial surface of the drain; and step 7, depositing a pixel electrode layer on the third isolation layer, and implementing a patterning process to the pixel electrode layer with a sixth mask to form the pixel electrode, wherein the pixel electrode contacts the drain through the third via;

wherein the step 4 also implements a patterning process to the first isolation layer to form a via penetrating the second isolation layer and the first isolation layer to expose a partial surface of the bottom gate when implementing the patterning process to the second isolation layer with the third mask; the top gate formed in the step 6 contacts the bottom gate through the via;

wherein a material of the first metal layer and the second metal layer is a stacked combination of one or more of molybdenum, titanium, aluminum and copper;

wherein a material of the first isolation and the second isolation layer is Silicon Oxide, Silicon Nitride or a combination of the two, and a material of the third isolation layer is organic photoresist;

wherein a material of the semiconductor layer is oxide semiconductor, amorphous silicon semiconductor or Low Temperature Poly-silicon semiconductor; and wherein the pixel electrode is a transparent electrode.

\* \* \* \* \*